United States Patent
Naidu et al.

(10) Patent No.: US 11,204,382 B2
(45) Date of Patent: Dec. 21, 2021

(54) TRAVELING WAVE BASED FAULT LOCATION USING UNSYNCHRONIZED MEASUREMENTS FOR TRANSMISSION LINES

(71) Applicant: ABB Power Grids Switzerland AG, Baden (CH)

(72) Inventors: Obbalareddi Demudu Naidu, Bangalore (IN); Rahul Nandkumar Gore, Satara (IN); Nandkishor Kubal, Pune (IN)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 16/764,695

(22) PCT Filed: Jun. 14, 2018

(86) PCT No.: PCT/IB2018/054380
§ 371 (c)(1),
(2) Date: May 15, 2020

(87) PCT Pub. No.: WO2019/097311
PCT Pub. Date: May 23, 2019

(65) Prior Publication Data
US 2021/0003625 A1 Jan. 7, 2021

(30) Foreign Application Priority Data
Nov. 17, 2017 (IN) .............................. 201741041164

(51) Int. Cl.
*G01R 31/08* (2020.01)
*H02J 3/18* (2006.01)

(52) U.S. Cl.
CPC ......... *G01R 31/085* (2013.01); *G01R 31/088* (2013.01); *H02J 3/1807* (2013.01)

(58) Field of Classification Search
CPC ... G01R 31/085; G01R 31/088; H02J 3/1807; H02H 7/265
(Continued)

(56) References Cited

U.S. PATENT DOCUMENTS

2006/0012374 A1* 1/2006 Kojovic ............... G01R 31/088
324/522

FOREIGN PATENT DOCUMENTS

WO 2016139613 A1 9/2016

OTHER PUBLICATIONS

Jung, Chae-Kyun, et al., "Fault Location Algorithm on Underground Power Cable Systems Using Noise Cancellation Technique", 2008 IEEE/PES Transmission and Distribution Conference and Exposition, Chicago, IL, USA, Apr. 21-24, 2008, 7 pages.
(Continued)

*Primary Examiner* — Farhana A Hoque
(74) *Attorney, Agent, or Firm* — Slater Matsil, LLP

(57) ABSTRACT

A method can be used to determine a fault location in a power transmission line that connects a first terminal with a second terminal. Parameters associated with travelling waves are detected from measurements carried out at the first and second terminals. The parameters include arrival times of first and second peaks of the travelling waves at the first and second terminals respectively, and rise times of the first peaks of corresponding travelling waves. A first half, a second half, or a mid-point of the power transmission line is identified as having a fault based on the parameters. The fault location can be estimated based on the arrival times of the first and second peaks of the travelling waves detected from measurements carried out at the first and second terminals, a velocity of propagation of the travelling wave in the power transmission line, and/or a length of the power transmission line.

21 Claims, 6 Drawing Sheets

(58) Field of Classification Search
USPC .......................................................... 324/522
See application file for complete search history.

(56) References Cited

OTHER PUBLICATIONS

Lopes, F. V., et al., "Real-Time Traveling-Wave-Based Fault Location Using Two-Terminal Unsynchronized Data", IEEE Transactions on Power Delivery, vol. 30, No. 3, Jun. 2015, pp. 1067-1076.
Schweitzer, III, Edmund O., et al., "Locating Faults by the Traveling Waves They Launch", 67th Annual Conference for Protective Relay Engineers, Mar. 31, 2014, 18 pages.
Altay, Özkan, et al., "Travelling Wave Fault Location on Hybrid Power Lines", 2016 IEEE International Conference on High Voltage Engineering and Application (ICHVE), Sep. 19-22, 2016, Chengdu, China, 4 pages.

* cited by examiner

TRAVELING WAVE BASED FAULT LOCATION USING UNSYNCHRONIZED MEASUREMENTS FOR TRANSMISSION LINES

CROSS-REFERENCE TO RELATED APPLICATIONS

This patent application is a national stage filing of International Application No. PCT/IB2018/054380, filed on Jun. 14, 2018, which claims the benefit of Indian Patent Application No. 201741041164, filed Nov. 17, 2017, which applications are hereby incorporated by reference in their entirety.

FIELD OF THE INVENTION

The present invention generally relates to fault location in power transmission lines. More specifically, the present invention relates to travelling wave based fault location with measurements at two ends of a power transmission line.

BACKGROUND OF THE INVENTION

Faults in transmission lines can occur because of bad weather conditions (e.g. due to storms, lightning, snow, freezing, rain), electrical disturbances (e.g. insulation breakdown, short circuits etc.) etc. Quick identification of fault location improves the reliability, availability and may prevent revenue losses.

Fault location methods are classified into two categories based on the availability of input quantities, namely single ended and two ended. According to fault location principle fault location methods are categorized as impedance based methods and traveling wave based methods Impedance-based fault locating methods require that the fundamental voltage and current quantities should be accurately measured. This requires signal filtering and signals of long enough duration to measure.

Integration of renewable energy (low inertia) systems to the grid can have an impact on the grid stability limits, and this will require faster fault clearing protection and reclosing schemes. Also, fast protection (e.g. traveling wave based) schemes will clear the fault in less than two cycles. If faults get cleared faster than two cycles, the current may not reach to its steady state, and the voltage may not drop from its faulted state to steady-state, so the impedance based fault locator tends to estimate location inaccurately.

With recent improvements in data acquisition and signal processing technology, traveling-wave fault locators are becoming more popular where higher accuracy is important.

Fault location using the traveling wave can be estimated by multiplying the time difference between initial traveling waves and/or its reflection at the point and propagation velocity. Communication based methods are considered more accurate and reliable. Existing prior art communication based methods requires the two end synchronized measurements, different experiments to correct the processing (hardware and software) delays and substation cable delays. This is not cost effective and may not be accurate.

The reliability of such communication based methods depends on the data synchronization, data processing delays (both software and hardware), communication latency and substation cable delays. The prior art methods assume that processing and substation cables delays are equal, no communication latency, and signals are perfectly synchronized with GPS. Hence, these delays are assumed to get canceled out in such fault location methods. However, this assumption is not true as both side delays are unequal or unsymmetrical, and 100% synchronization is not possible and depends on many practical parameters.

In view of the above, there is a need for accurate fault location method which can overcome these challenges.

SUMMARY OF THE INVENTION

The invention provides a method for fault location using unsynchronized measurements in a power transmission line. The transmission line can be an overhead line, or an underground cable, which connects a first terminal and a second terminal.

There may be an electrical fault (or disturbance) at a particular location in the power transmission line. The fault may be in a half (e.g. first half of the line, second half of the line), or at the mid-point of the line. Such a faulty half (or mid-point) can be identified as having the fault from measurements carried out at the two terminals (i.e. measurements carried out at the first terminal and the second terminal). These measurements include current/voltage measurements carried out using measurement equipment. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the line.

Travelling waves are generated when there are faults in the line. The method comprises obtaining a plurality of parameters associated with travelling waves detected from measurements carried out at the first and second terminals. A travelling wave, and parameters thereof (e.g. arrival time, peak width, rise time etc.), can be detected from the measurements carried out at a terminal(s) (e.g. from the one or more signals received from the one or more measurement equipment). For example, a current signal may be digitized and processed to detect a travelling wave.

Different travelling waves are generated due to the fault, and can be detected from measurements at different terminals. The method comprises obtaining the plurality of parameters associated with the travelling wave detected from measurements at the first terminal, and obtaining the plurality of parameters associated with the travelling wave detected from measurements at the second terminal.

In an embodiment, the plurality of parameters comprises arrival time of a first peak and arrival time of a second peak of the travelling wave, and a rise time of the first peak. Thus, for the travelling wave detected from the measurements carried out at the first terminal, the arrival time of the first peak, the arrival time of the second peak, and the rise time of the first peak are obtained. Similarly, for the travelling wave detected from the measurements carried out at the second terminal, the arrival time of the first peak, the arrival time of the second peak, and the rise time of the first peak are obtained.

The method further comprises identifying the faulty half, or the mid-point as having the fault. The faulty half (or mid-point) of the line is identified with the fault based on a comparison of the rise time of the first peak of the travelling wave detected from measurements carried out at the first terminal, with the rise time of the first peak of the travelling wave detected from measurements carried out at the second terminal. The difference between the rise times can be compared with a threshold value to determine the faulty half (or mid-point). The threshold value may be determined according to the sampling frequency. For example, for a 1

MHz sampling the threshold can be 1 or 2 micro seconds. The threshold value can be determined beforehand (e.g. set by a personnel). Once it is determined that the fault is not at the mid-point, another comparison of the rise times can be performed to identify the faulty half. Here, one of the first half and the second half is identified as the faulty half. Such identification may be done by checking which of the two rise times is of a higher value.

This faulty half (or mid-point) identification is used for estimating the fault location. Depending on whether the fault is identified in the first half, the second half, or the mid-point, the fault location can be estimated using one or more of the plurality of parameters obtained from measurements at the two terminals, and other line parameters such as propagation velocity, line length etc.

If the fault is identified in the first half, the fault location (d1) can be estimated by:

$$d1 = ((tm2 - tm1) + (tn2 - tn1)) \times \frac{V}{4}.$$

If the fault in identified in the second half, the fault location (d2) can be estimated by:

$$d2 = L - ((tm2 - tm1) + (tn2 - tn1)) \times \frac{V}{4}.$$

In the above, tm1, tm2, tn1, and tn2 are the arrival times of the first and second peaks of the travelling waves detected from measurements carried out at the first and the second terminals respectively, V is the velocity of propagation of the travelling wave (propagation velocity) in the power transmission line, and L is the length of the power transmission line (line length).

In case the fault location is identified as the mid-point, the fault location can be estimated by taking an average of two fault locations, wherein a first fault location is estimated for fault in the first half of the line, and a second fault location is estimated for a fault in the second half of the line.

The method described hereinabove, may be implemented with one or more devices associated with the power transmission line. The devices may include a power system device such as a relay, an Intelligent Electronic Device (IED) or fault locator, and/or a server connected with the power system devices. In the case wherein the method is implemented with an IED or relay, the device may be associated with bus M or bus N, or other point in the line. Here, the device estimates the required parameters/receives the parameters for fault location from other power system devices. For example, IED at bus M can obtain travelling wave related parameters from measurements at bus M, and receive the travelling wave related measurements at bus N from another IED or power system device. In this example, the IED can receive a signal(s) from the measurement equipment, and obtain measurements therefrom, or the measurement equipment publishes the measurements over a bus (e.g. process bus), and the IED (e.g. subscribed to receive data from such bus) receives the measurements over the bus. The travelling wave detection may alternately be performed at another power system device, and the obtained measurements (or parameters) may be communicated to the IEDs or server implementing the method.

Thus, the steps of the method may be performed by one or more modules. The modules may be implemented with one or more processors. For instance, in the example where the IED performs the method, the modules are implemented with the processor of the IED. In the other example where a server performs the method, the modules are implemented with the processor of the server. In case the method is implemented in part by IED, and in part by the server, the modules (depending on the step) will be distributed accordingly in the IED and the server.

In one embodiment, the modules comprise a travelling wave detector, a faulty half identifier and a fault locator. The travelling wave detector is for obtaining the plurality of parameters associated with the travelling waves detected from the measurements carried out at the first and second terminals. The faulty half identifier is for identifying one of the first half, the second half, and the mid-point of the power transmission line, as having the fault. The fault locator is for estimating the fault location based on the identification of the first half, the second half and the mid-point, as having the fault.

BRIEF DESCRIPTION OF DRAWINGS

The subject matter of the invention will be explained in more detail in the following text with reference to exemplary embodiments which are illustrated in attached drawings in which.

DETAILED DESCRIPTION

Figure 1:
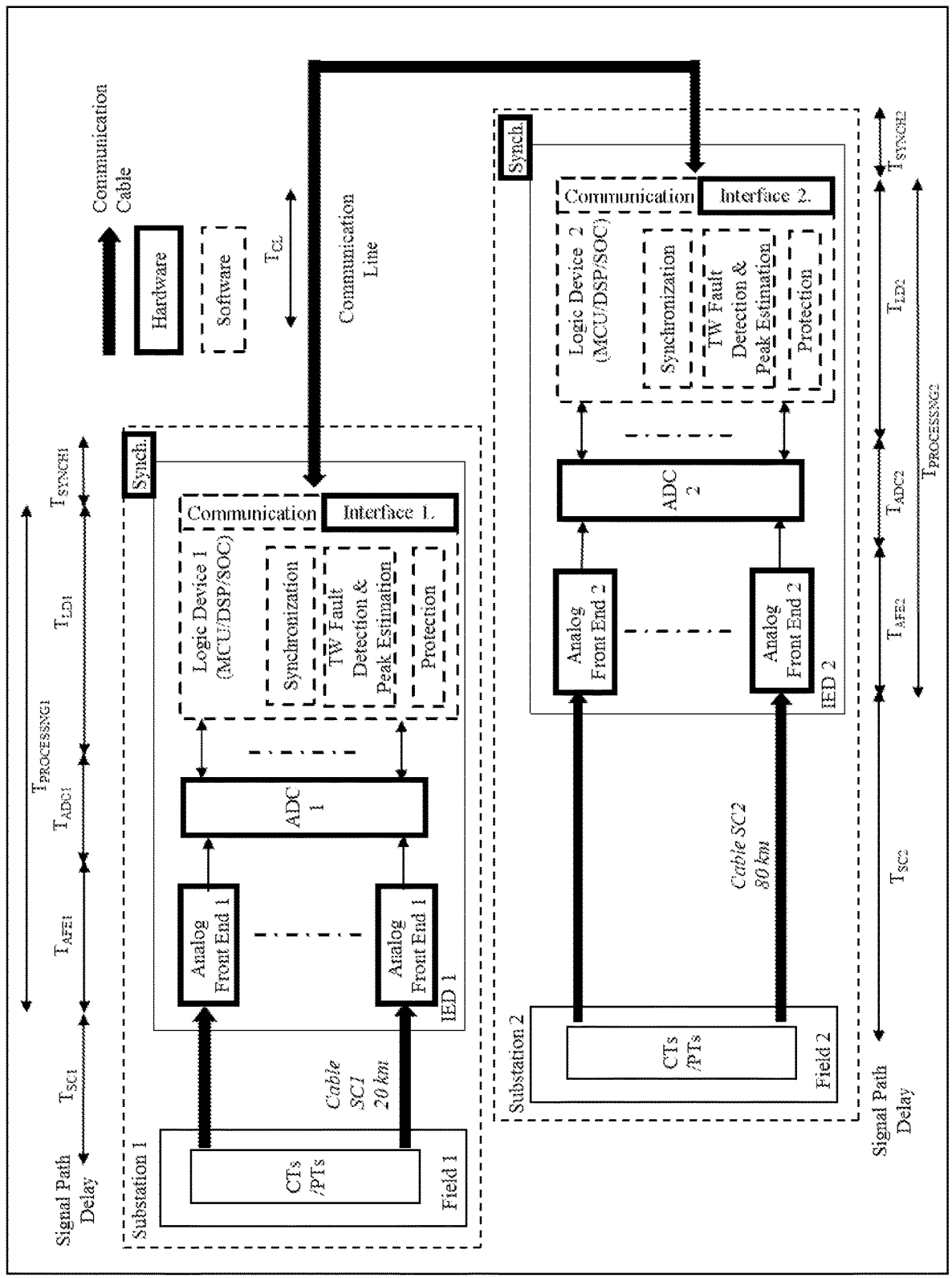
FIG. 1 is shows a simplified representation of an IED system.

Consider the hardware and software representation of an IED system shown in FIG. 1. IED 1 and IED 2 are placed in respective substations 1 and 2, and receive voltage and/or current signals from field 1 and 2 respectively via copper substation cables (SC1 and SC2). Both substations are connected to each other via communication line (CL) for data exchange. Assuming fault location calculation is being performed at IED 1, a signal delay can be calculated using:

Signal delay of field 1 data at $IED1=TSC1+TPROCESSING1+TSYNCH1$ (A.1)

Signal delay of field 2 data at $IED2=TSC2+TPROCESSING2+TSYNCH2+TCL$ (A.2)

Typically, a synchronization means like GPS can give synchronization accuracy of micro-seconds or less. However, there are a number of practical difficulties in achieving the estimated data synchronization level between two IEDs as explained below.

Non-Identical Synchronization Device Errors (ΔTSYNCH=TSYNCH1−TSYNCH2):

All time synchronization systems including GPS, introduce an error or offset in the time distribution signal, due to dynamic nature of environment as well as external disturbances, which can lead to a false timing signal and erroneous synchronization. This synchronization error can be different for IEDs at both ends, depending upon the synchronization method (e.g. IED 1 using GPS, and IED 2 using NTP server), environment (indoor and outdoor environment; different level of electromagnetic interference etc.) etc. Hence there is a finite inaccuracy in synchronization (ΔTSYNCH) of IEDs at both ends. This error can be of the order of few hundred microseconds.

Non-Identical Substation Cable Delays Due to Different Make, Length Cables (ΔTSC=TSC1−TSC2):

The copper substation cables laid to carry voltage and/or current from field to substation are different for both the IEDs due to different cable makes as well as different lengths (e.g. substation 1 using 50-meter cable and substation 2 using 800-meter cable). Hence delays TSC1 and TSC2 are different in magnitude, resulting in different propagation velocities for both side data signals. This introduces a finite delay error ΔTSC of the order of few hundred microseconds. Sometimes, this delay is calibrated in field and compensated in algorithm by conducting experiments. However, this approach is cumbersome and costly as number of field measurements are to be carried out manually to arrive at reasonably correct calibration parameters and the calibration needs to be carried out periodically as physical conditions change over time.

Inconsistent IED Processing Delays due to different hardware, software (ΔTPROCESSING=TPROCESSING1−TPROCESSING2):

A typical IED comprises of analog front end (AFE), ADC and logic device (LD—microcontroller unit or DSP or System on chip) with communication interface. If IED 1 and IED 2 are of different versions (e.g. IED 1 using a discrete component board, and IED 2 using an integrated component SoC version) or of different make altogether (e.g. IED 1 using microcontroller and IED 2 using FPGA), the hardware and software implementation is not unique for both the IEDs. The delays TAFE1, TADC1 & TLD1 are different than TAFE2, TADC2 & TLD2 respectively and hence TPROCESSING1≠TPROCESSING2 and there is a finite ΔTPROCESSING with worst case magnitude of the order of tens of microseconds.

Non-Deterministic Communication Line Delay Due to Higher Bandwidth Utilization (TCL):

IEDs exchange Disturbance Records (DRs) so that voltage and/or current data can be time synchronized. Typical size of DR is of the order of few hundreds of kilobytes. This along with regular data exchange, load communication network between IEDs significantly results in non-deterministic data packet delays.

Thus, total inaccuracy in data synchronization for the entire IED system can be calculated as below:

Total Synchronization Error for *IED* System=Δ*TSC*+Δ*TPROCESSING*+Δ*TSYNCH*  (A.3)

This clearly implies that a total synchronization error of the order of few hundred microseconds can result in approximately 2 km to 5 km error in fault location for a 120 Km transmission line. Cost and maintenance borne substation cable field measurements and calibration can bring down the substation cable related error in the beginning, but cannot reduce the total error significantly due to other unaddressed factors. This along with communication link overload due to frequent DR exchanges results in an unreliable and costly IED system.

Existing prior art communication based methods requires the two side synchronized measurements, and different experiments to correct the processing (hardware and software) delays and substation cable delays. This is not cost effective and not practical.

The present invention provides a method which is independent of data synchronization, processing delays, communication latency and substation cable delays. An accurate traveling wave based fault location method for transmission line using unsynchronized current or voltage measurements is disclosed. The accuracy of fault location is independent of processing (hardware and software) delays. Further, GPS synchronization is not required (or no GPS), which will save cost. Less communication bandwidth is required as this method requires only two traveling wave peak arrival times (not required to have complete DR). Further, the method does not require experiments to correct the substation cable delay and other processing delays.

Figure 2:
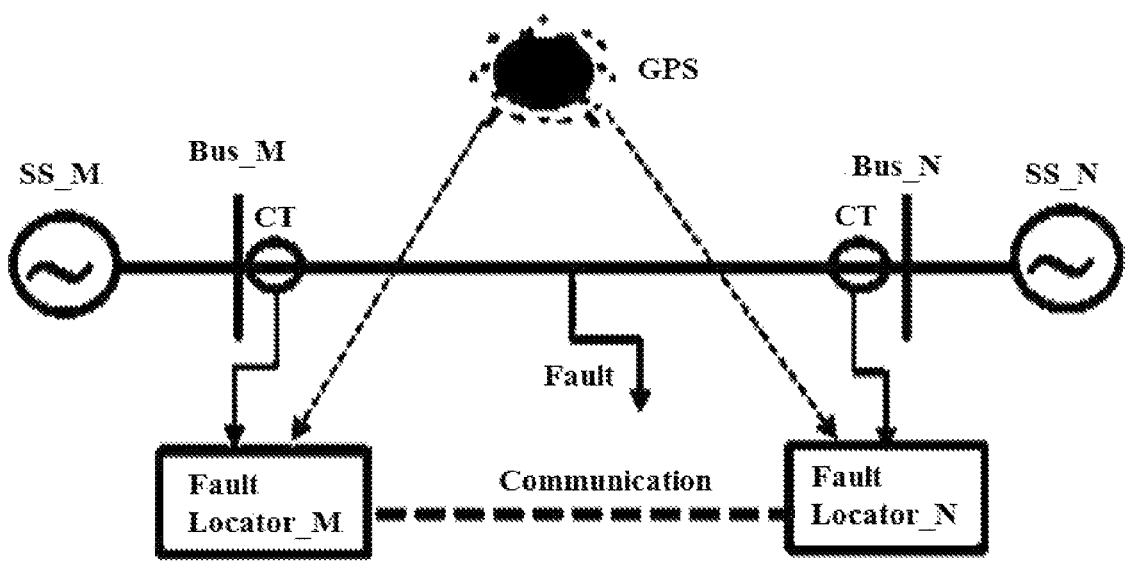
FIG. 2 is a simplified representation of a GPS based system for fault location in a power transmission line.
Figure 3:
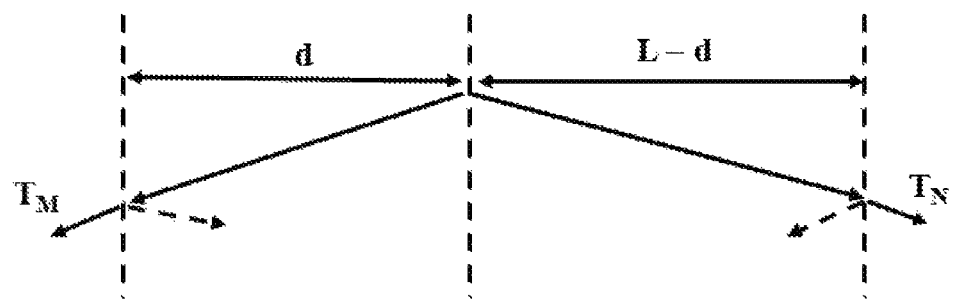
FIG. 3 is a Bewley lattice diagram for an internal fault case.

Consider two substations M and N are connected by the transmission line as shown in FIG. 2. Two fault locators are placed at bus M and N respectively. FIG. 3 shows a Bewley lattice diagram for case, when the fault has occurred transmission line. In this case the first traveling wave peak arrival times are recorded at each fault locator placed at bus M and N.

For a fault at 'd' km from bus/terminal M and 'L−d' km from bus N, peak arrival times can be expressed as in equation (B.1) and (B.2) below.

$$tm = t0m + tdm + tsm + \frac{d}{V} \quad (B.1)$$

$$tn = t0n + tdn + tsm + \frac{L-d}{V} \quad (B.2)$$

where,
L=Length of transmission line;
V=Propagation velocity of transmission line
t0m=fault detected time at bus M;
t0n=fault detected time at bus N;
tdm=processing delay (hardware+software+substation cable) from M side;
tdn=processing delay (hardware+software+substation cable) from N side;
tsm=data synchronization error at bus M;
tsn=data synchronization error at bus N;
tm=first peak arrival time at bus M;
tn=first peak arrival time at bus N; and
d=fault location.

Solving the equations (B.1) and (B.2), fault location is given by equation (B.3) assuming that (t0m+tdm+tsm) and (t0n+tdn+tsn) equal (i.e. both side IEDs are detected the fault in same time, no synchronization error, no substation cable and processing delay).

$$d=(L-(tn-tm)V)\times\frac{1}{2} \quad (B.3)$$

However, this assumption is not true in reality as both side delays are unequal or unsymmetrical and depend on many practical parameters as shown in FIG. 1.

Figure 4:
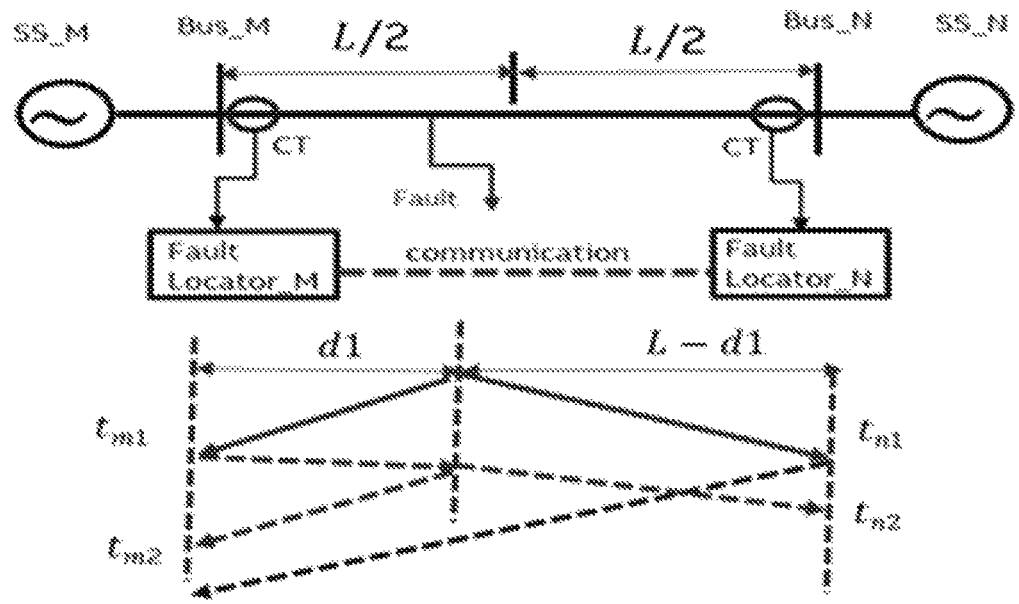
FIG. 4 is a Bewley lattice diagram for fault in a first half of the line.

FIG. 4 shows Bewley lattice diagram for case, when the fault has occurred in the first half of the line. In this case the first peak as well as the second peak arrived from the fault point from M side and first peak is arrived from fault point and second peak is arrived from far end bus from N side. The fault location can be calculated as follows. From FIG. 4 Bewley lattice diagram, we can write $$tm1 = t0m + tdm + tsm + \frac{d1}{V};$$

$$tm2 = t0m + tdm + tsm + \frac{3d1}{V}$$

(C.1)

$$tn1 = t0n + tdn + tsn + \frac{L-d1}{V};$$

$$tn2 = t0n + tdn + tsn + \frac{d1+L}{V}$$

(C.2)

where, tm1 and tm2=first and second peak arrival times at bus M; tn1 and tn2=first and second peak arrival times at bus N; and d1=fault location.

Solving the equations (C.1) and (C.2), fault location is given by equation (C.3).

$$d1 = ((tm2 - tm1) + (tn2 - tn1)) \times \frac{V}{4}$$

(C.3)

Figure 5:
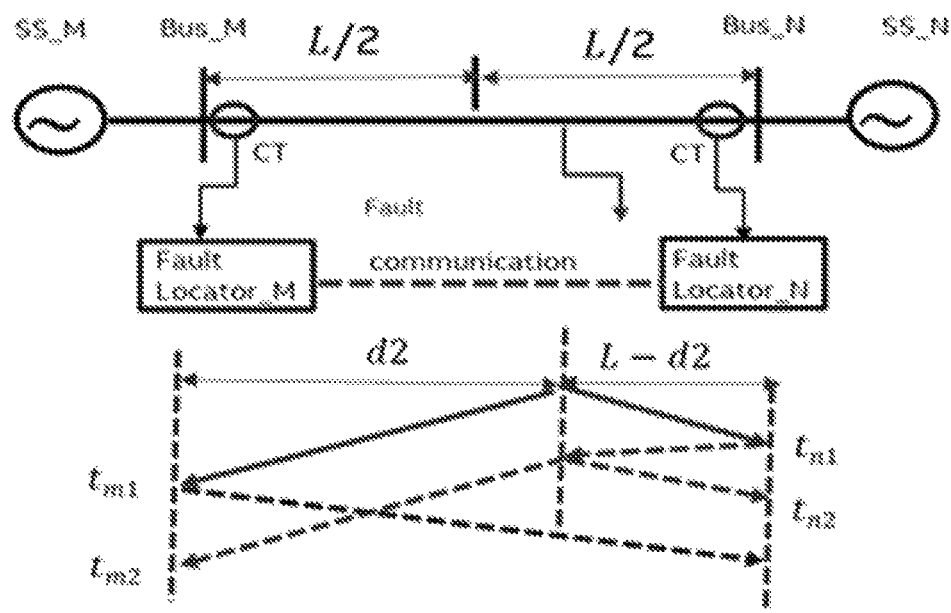
FIG. 5 is a Bewley lattice diagram for fault in a second half of the line.

FIG. 5 shows Bewley lattice diagram for case, when the fault has occurred in the second half of the line. In this case a first peak is arrived from fault point and second peak is arrived from far end bus from M side and the first peak as well as the second peak arrived from the fault point from N. The fault location can be calculated as follows. From FIG. 5 Bewley lattice diagram, we can write $$t0m + tdm + tsm + tm1 = \frac{d2}{V};$$

$$t0m + tdm + tsm + tm2 = \frac{2L-d2}{V}$$

(C.4)

$$t0n + tdn + tsn + tn1 = \frac{L-d2}{V};$$

$$t0m + tdm + tsn + tn2 = \frac{3(L-d2)}{V}$$

(C.5)

where, tm1 and tm1=first and second peak arrival times at bus M; tn1 and tn2=first and second peak arrival times at bus N; and d2=fault location Solving the equations (C.4) and (C.5), fault location is given by equation (C.6)

$$d2 = L - ((tm2 - tm1) + (tn2 - tn1)) \times \frac{V}{4}$$

(C.6)

Hence, we need to select the actual fault location from the two fault location estimates calculated using equation (C.3) and (C.6). For this, we need to know if the fault has occurred in the first half or the second half of the line.

Faulty Half Identification:

Let us consider rising edge (charging) of the first current travelling wave recorded is given by equation (C.7).

$$I_M = I_o(1 - e^{-t/\tau})$$

(C.7)

where, $\tau$ is the time constant of the equivalent circuit from the source to the fault point, $I_0$ is the maximum amplitude of the first peak of the current travelling wave recorded either at bus M or N and I(t) is the amplitude of the peak at any time t.

Figure 6:
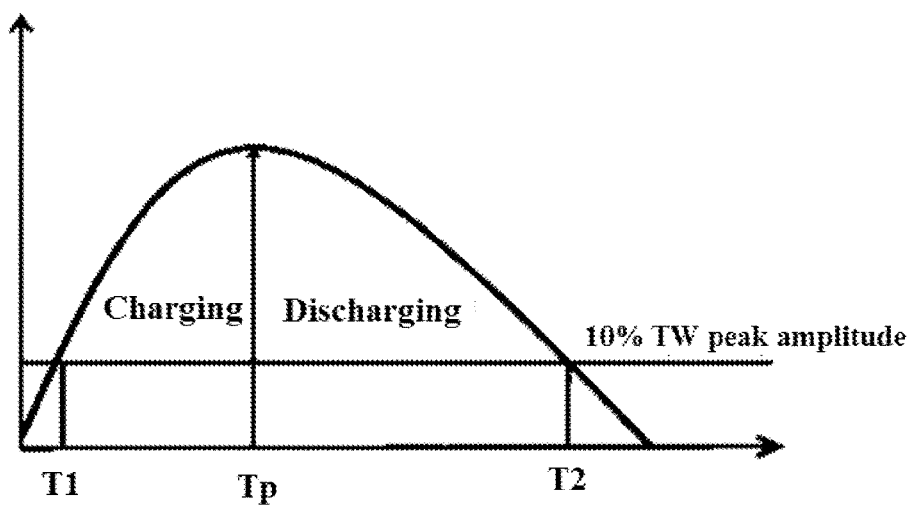
FIG. 6 shows a charging and discharging pattern of an RL electrical circuit.

From FIG. 6, let T1 and Tp be the time taken for the current to rise from 10% of the traveling wave peak amplitude to the maximum peak amplitude i.e. from $0.1I_0$ to $I_0$. From equation (C.7), the difference of time T1 and Tp at which I (t) is equal to 0.1I0 and I0 can be calculated as, $$TW_{risetime} = T_P - T_1 = 2.302\tau$$

(C.8)

where, $\tau$=time constant of the circuit is given by L/R (L is inductance per meter and R is resistance per meter)

$TW_{risetime}$ is approximately proportional to distance of the line and its depends on TW energy loss.

Figure 7A:
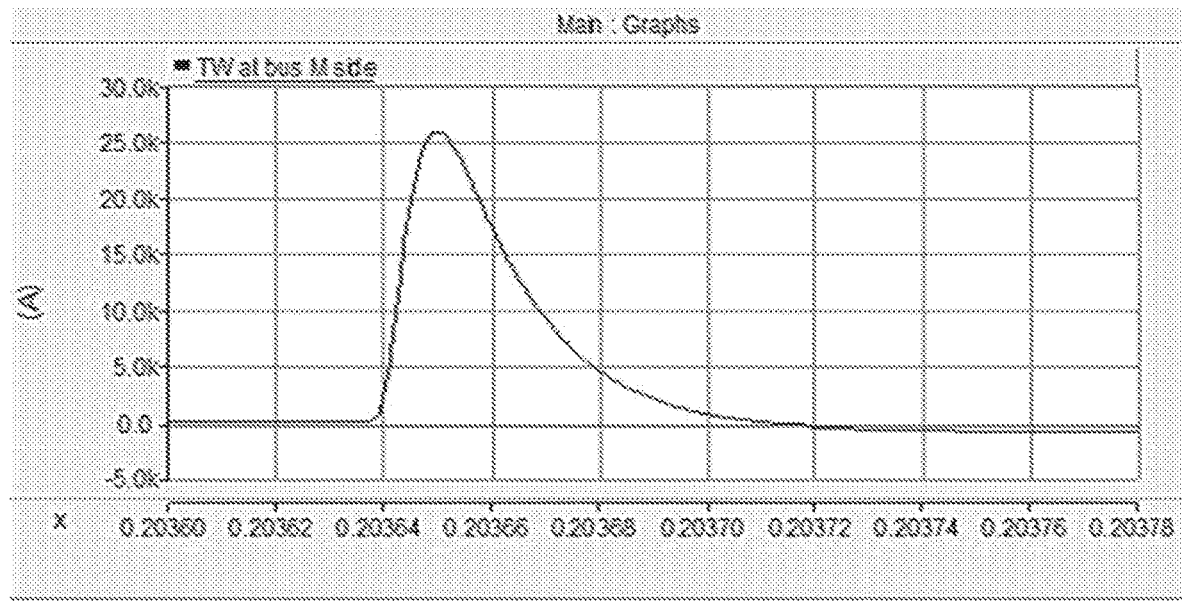
FIGS. 7(a) and 7(b) show first peaks of travelling waves recorded at bus M and N respectively for fault in the first half.
Figure 7B:
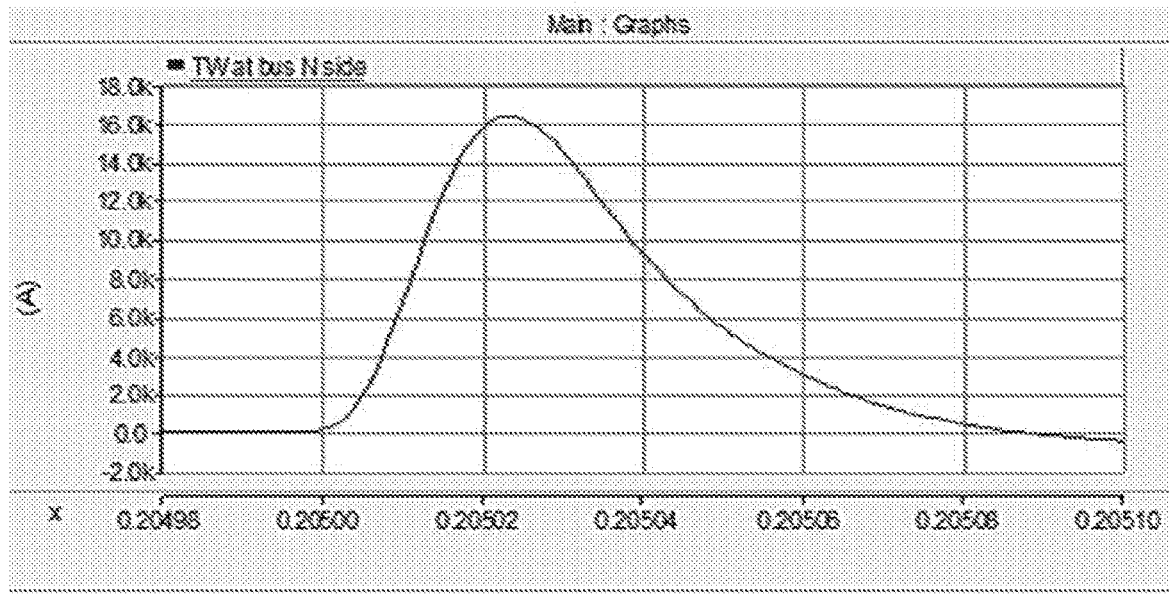

FIG. 7 shows first peaks of the current travelling wave recorded at bus M and N for a fault at 20 Km from bus M. FIGS. 7(*a*) and 7(*b*) shows the first peak of the current travelling wave recorded at the bus M and N respectively, for a fault at the 20 Km from bus M.

It is obvious from the plots that the rise time of the first TW peak measured at M side is less than N side for a 120 Km transmission line. The rise time of the current traveling wave measured is estimated from the plot (a) and (b) are 3.61 and 7.26 microseconds respectively.

Faulty half (or section) can be identified by comparing the rise time or area of the traveling waves recorded at bus M and N. For example, rise time estimated at bus M (3.61 µs) is less than bus N (7.26 µs) then the fault is identified as first half.

Figure 8:
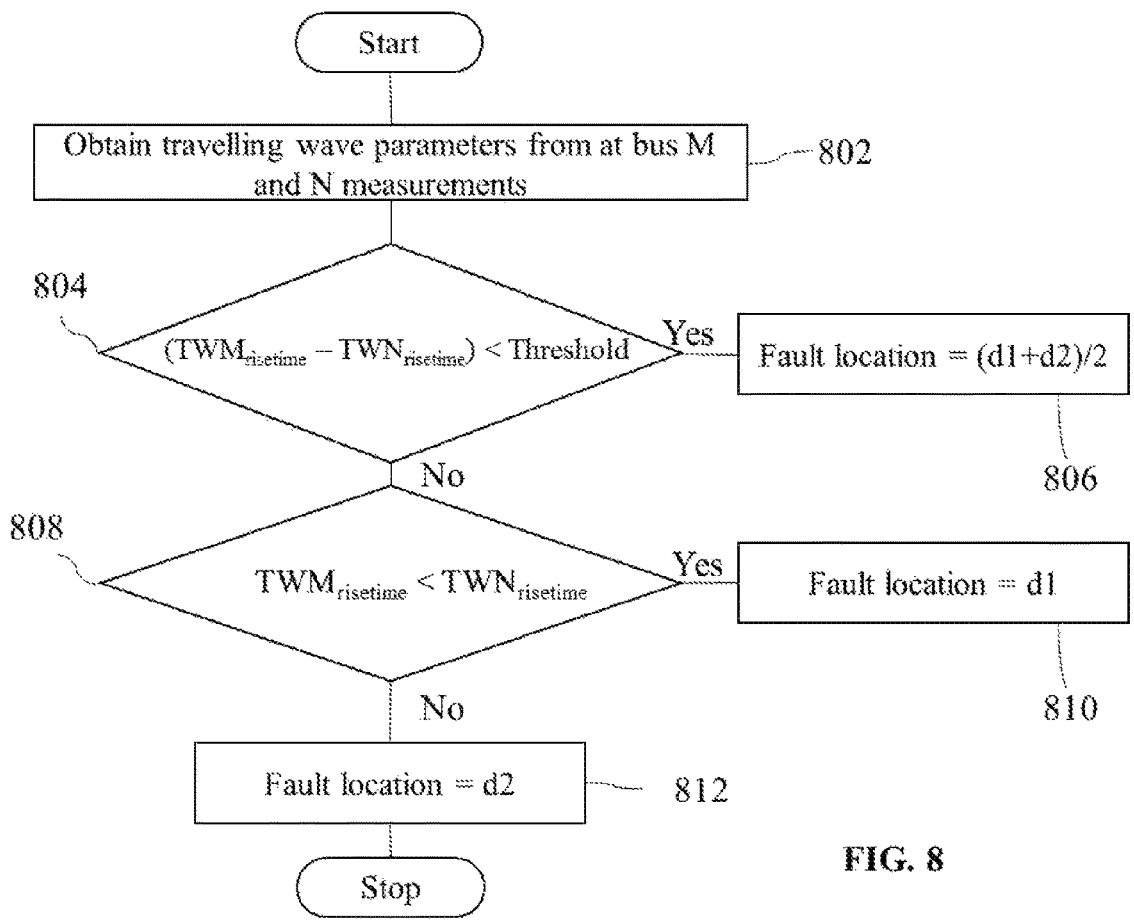
FIG. 8 is a flowchart of a method for fault location in the power transmission line, in accordance with an embodiment of the invention.

Referring now to FIG. 8, which is a flowchart of the method for fault location in the power transmission line, in accordance with an embodiment of the invention.

At 802, travelling wave parameters are obtained. In case the fault locators shown in FIGS. 2, 4 and 5 are used for implementing the method, travelling waves can be detected by the fault locators at bus M (first terminal) and bus N (second terminal) respectively. Alternately, a travelling wave detector may be used for detecting the travelling wave and obtaining the parameters (e.g. arrival time, peak width, rise time etc.) thereof. The travelling wave detector may be a standalone device (connected with the measurement equipment such as CT at bus M) or a module implemented with a processor of a power system device (such as 902).

In accordance with some embodiments (e.g. illustrated with FIGS. 4 and 5), the first and second peak arrival times at bus M (tm1 and tm2) and bus N (tn1 and tn2), and the rise time of the first peak at bus M ($TWM_{risetime}$) and bus N ($TWN_{risetime}$) are obtained.

The method also comprises identifying the faulty half, or the mid-point as having the fault. The faulty half (or mid-point) of the line is identified with the fault based on a comparison of the rise time estimates for the first peak at bus M and N respectively. In the embodiment of FIG. 8, the difference between the rise times of the first peaks is compared with a threshold value to determine the faulty half (or mid-point). For example it can be checked if the difference between the rise times is less than the threshold value as shown in 804. The threshold value may be determined according to the sampling frequency. For example, for a 1 MHz sampling the threshold can be 1 or 2 micro seconds.

The threshold value can be determined beforehand (e.g. set by a personnel). According to the comparison at 804, another comparison of the rise times can be performed to identify the faulty half. For example, it can be determined if less than $TWM_{risetime}$ is less than $TWN_{risetime}$ as shown in 808. If $TWM_{risetime}$ is determined to be less than $TWN_{risetime}$, the fault is determined to be located in the first half (refer description above w.r.t FIGS. 6, 7(*a*), and 7(*b*)). Alternately, the fault is determined to be in the second half of the line. First half in accordance with the examples shown would refer to the part of the line from bus M to the mid-point, which has length L/2, and similarly second half would refer to the part from bus N to the mid-point, which also has length L/2.

If the fault is identified in the first half based on comparison at 808, the fault location (d1) can be estimated at 810 using C(3), i.e.:

$$d1 = ((tm2 - tm1) + (tn2 - tn1)) \times \frac{V}{4}.$$

If the fault in identified in the second half based on comparison at 808, the fault location (d2) can be estimated at 812 using C(6), i.e.:

$$d2 = L - ((tm2 - tm1) + (tn2 - tn1)) \times \frac{V}{4}.$$

In case the fault location is identified to be at the mid-point (i.e. around mid-point region) at 804, then the fault location is estimated by (d1+d2)/2 as shown at 806.

As described above, the method may be implemented by one or more devices associated with the power transmission line such as IEDs (or fault locators), relays or other such power system devices. In accordance with the embodiments shown in FIGS. 4 and 5, the method is implemented with the fault locator at bus M, or with the fault locator at bus N. Alternately, both the fault locators may implement the method. Here, the fault locator at bus M gets the travelling wave measurements at bus M, and similarly the fault locator at bus N gets the travelling wave measurements at bus N. In this example, the IED can receive a signal(s) from the measurement equipment (here CT as shown in FIG. 4, or 5), and obtain measurements therefrom, or the measurement equipment publishes the measurements over a bus (e.g. process bus), and the IED (e.g. subscribed to receive data from such bus) receives the measurements over the bus. The fault locators communicate with each other through standard communication. Thus, the fault locator at bus M sends the travelling wave related information to the fault locator at bus N (and vice versa).

Figure 9:
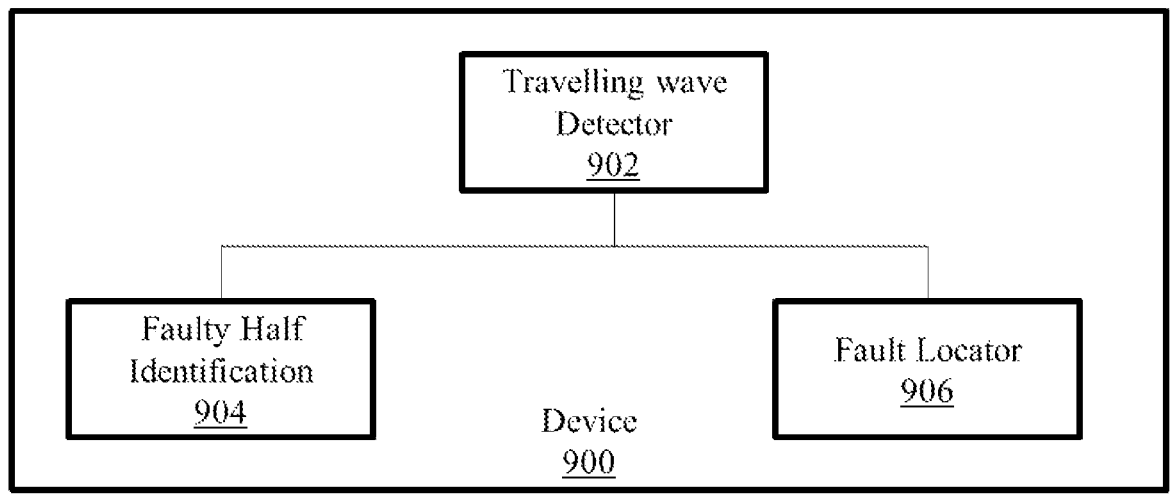
FIG. 9 is a simplified block diagram of a device for fault location, in accordance with an embodiment of the invention.

The steps of the method may be performed by one or more modules. The modules may be implemented with one or more processors. For instance, in the example where the fault locator performs the method, the modules are implemented with the processor of the fault locator (at bus M, or bus N or in each fault locator). Such an embodiment is illustrated in FIG. 9. Here, the device (900) comprises a travelling wave detector (902), faulty half identifier (904) and a fault locator (906). The travelling wave detector obtains the travelling wave parameters as described hereinabove. This module may additionally detect the travelling waves from the measurements, and obtain the parameters accordingly. The faulty half identifier identifies the faulty half or mid-point (region) as having the fault, and the fault locator locates the fault based on the faulty half identification and travelling wave parameters.

Figure 10:
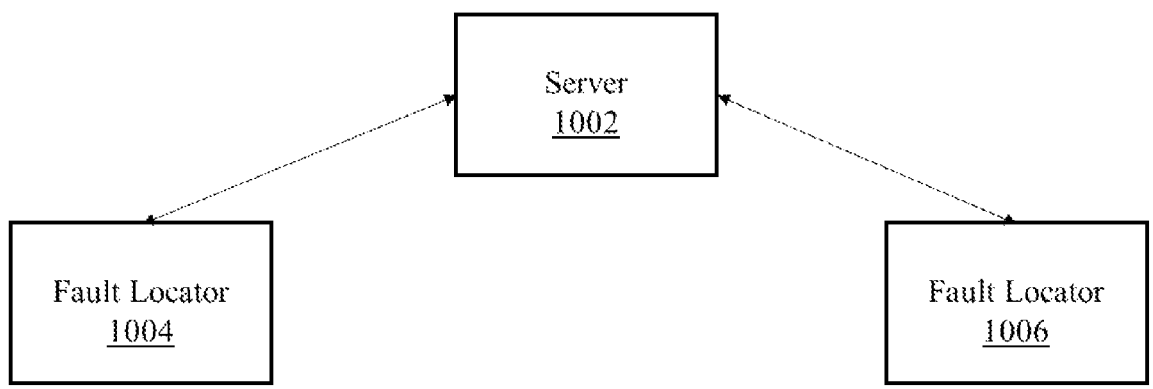
FIG. 10 is a simplified representation of a system for fault location, in accordance with an embodiment of the invention.

An example where a server (1002) performs the method is shown in FIG. 10. In this embodiment, the modules are implemented with the processor of the server. In case the method is implemented in part by IED, and in part by the server, the modules (depending on the step) will be distributed accordingly in the IED and the server. For example, the travelling wave detector may be provided on different fault locators (such as 1004, 1006), which obtain and communicate the travelling wave parameters to the server, which has the faulty half identifier and the fault locator. The fault location can be communicated to the fault locators for display.

As the fault location estimation is performed using the faulty half identification, with the arrival times of the first and the second peaks respectively, the affect due to the delays are minimized or eliminated. By taking a difference in the arrival times of the first peak and the second peaks at the same terminal, the delays such as data processing delays (both software and hardware), communication latency, substation cable delays etc. can be cancelled out.

We claim:

1. A method for fault location in a power transmission line that connects a first terminal with a second terminal, wherein the method is implemented with a processor of a device associated with the power transmission line, the method comprising:

obtaining a plurality of parameters associated with traveling waves detected from measurements carried out at the first and second terminals, wherein the plurality of parameters comprises arrival times of a first peak and a second peak of traveling waves detected from the measurements carried out at the first and second terminals respectively, and rise times of the first peaks of corresponding traveling waves;

identifying a first half, a second half, or a mid-point of the power transmission line as having a fault, based on a comparison of the rise time of the first peak of a traveling wave detected from measurements carried out at the first terminal, with the rise time of the first peak of a traveling wave detected from measurements carried out at the second terminal; and determining the fault location based on the arrival times of the first and second peaks of the traveling waves detected from measurements carried out at the first and second terminals, a propagation velocity of the traveling waves in the power transmission line, a length of the power transmission line, or a combination thereof, the determining being in response to identifying the fault being in one of the first half, the second half, or the mid-point of the power transmission line.

2. The method of claim 1, wherein identifying the fault being at the first half, the second half or the mid-point of the power transmission line comprises comparing a threshold value with the difference between the rise times of the first peaks of the traveling waves at the first and second terminals.

3. The method of claim 2, wherein identifying the fault being at the mid-point of the power transmission line is based on the difference between the rise times of the first peaks of the traveling waves at the first and second terminals being less than the threshold value.

4. The method of claim 2, wherein identifying the fault being at the first half or the second half is based on whether the difference between the rise time detected from measurements carried out at the first terminal and the rise time detected from measurements carried out at the second terminal is a positive or a negative value.

5. The method of claim 4, wherein identifying the fault being at the mid-point of the power transmission line is based on the difference between the rise times of the first peaks of the traveling waves detected at the first and second terminals being less than the threshold value.

6. The method of claim 5, wherein the fault location in the first half of the power transmission line is determined from $$\left(((tm2 - tm1) + (tn2 - tn1)) \times \frac{V}{4}\right);$$

wherein the fault location in the second half of the power transmission line is determined from $$\left(L - ((tm2 - tm1) + (tn2 - tn1)) \times \frac{V}{4}\right);$$

and wherein tm1, tm2, tn1, and tn2 are the arrival times of the first and second peaks of the travelling waves detected from measurements carried out at the first and the second terminals respectively, V is the propagation velocity of the traveling waves in the power transmission line, and L is the length of the power transmission line.

7. The method of claim 1, wherein identifying the fault being at the mid-point is determined by taking an average of first and second fault locations, wherein the first fault location is determined for a fault in the first half of the power transmission line, and the second fault location is determined for a fault in the second half of the power transmission line.

8. The method of claim 1, wherein the determining the fault location comprises:
determining the fault location based on a propagation velocity of the traveling waves in the power transmission line and the arrival times of the first and second peaks, the determining being in response to identifying the fault being in the first half of the power transmission line;
determining the fault location based on the propagation velocity of the traveling waves in the power transmission line, length of the power transmission line, and the arrival times of the first and second peaks, the determining being in response to identifying the fault being in the second half of the power transmission line; and
determining the fault location based on the length of the power transmission line, the determining being in response to identifying the fault being at the mid-point of the power transmission line.

9. A device for fault location in a power transmission line that connects a first terminal with a second terminal, the device comprising:
a traveling wave detector configured to obtain a plurality of parameters associated with traveling waves detected from measurements carried out at the first and second terminals, wherein the plurality of parameters comprises arrival times of a first peak of a traveling wave and a second peak of the traveling wave detected from the measurements carried out at the first and second terminals respectively, and rise times of the first peaks of the corresponding traveling waves;
a faulty half identifier configured to identify a first half, a second half, or a mid-point of the power transmission line as having the fault based on a comparison of the rise time of the first peak of the traveling wave detected from measurements carried out at the first terminal, with the rise time of the first peak of the traveling wave detected from measurements carried out at the second terminal; and
a fault locator configured to determine the fault location based on the arrival times of the first and second peaks of the traveling waves detected from measurements carried out at the first and second terminals, a propagation velocity of the traveling waves in the power transmission line, a length of the power transmission line, or a combination thereof, the determining being in response to identifying the fault being in one of the first half, the second half, or the mid-point of the power transmission line.

10. The device of claim 9, wherein the device is an intelligent electronic device associated with the first or the second terminal.

11. The device of claim 10, wherein the device is configured to receive the measurements carried out at the corresponding terminal from measurement equipment associated with the corresponding terminal, and to receive the measurements carried out at the other terminal over a communication channel from the device associated the other terminal of the power transmission line.

12. The device of claim 9, wherein the device is a server configured to be connected with intelligent electronic devices associated with the first and second terminals.

13. The device of claim 12, wherein the server is configured to receive the plurality of parameters obtained by the intelligent electronic devices from the measurements carried out at the respective terminals.

14. A method for fault location in a power transmission line that connects a first terminal with a second terminal, the method comprising:
measuring voltages or currents at the first terminal;
measuring voltages or currents at the second terminal;
detecting a traveling wave carried on the power transmission line based on measurements of the voltages or currents carried out at the first and second terminals;
calculating a plurality of parameters associated with the traveling wave based on the measurements carried out at the first and second terminals, wherein the plurality of parameters comprises arrival times of a first peak and a second peak of the traveling wave at the first terminal, a rise time of the first peak at the arrival time at the first terminal, an arrival times of a first peak and a second peak of the traveling wave at the second terminal, and a rise time of the first peak at the arrival time at the arrival time at the second terminal;
identifying a rough location of a fault in the power transmission line based on a comparison of the rise time of the first peak of the travelling wave at the first terminal with the rise time of the first peak of the travelling wave at the second terminal, the rough location being a first half, a second half, or a mid-point of the power transmission line; and
determining the fault location based on the arrival times of the first and second peaks of the travelling waves detected from the measurements carried out at the first and second terminals, a propagation velocity of the traveling waves in the power transmission line, a length of the power transmission line, or a combination thereof, the determining being in response to identifying the fault being in one of the first half, the second half, or the mid-point of the power transmission line.

15. The method of claim 14, wherein identifying the rough location of the fault comprises comparing a threshold value with the difference between the rise times of the first peaks of the traveling waves at the first and second terminals.

16. The method of claim 15, wherein the identifying the fault being at the mid-point of the power transmission line is based on the difference between the rise times of the first peaks of the traveling waves detected at the first and second terminals being less than the threshold value.

17. The method of claim 15, wherein identifying the fault being at the first half or the second half is based on whether the difference between the rise time calculated from measurements carried out at the first terminal and the rise time calculated from measurements carried out at the second terminal is a positive or a negative value.

18. The method of claim 17, wherein identifying the fault being at the mid-point of the power transmission line is based on the difference between the rise times of the first peaks of the traveling waves detected at the first and second terminals being less than the threshold value.

19. The method of claim 14, wherein identifying the fault being at the mid-point is determined by taking an average of first and second fault locations, wherein the first fault location is determined for a fault in the first half of the power transmission line and the second fault location is determined for a fault in the second half of the power transmission line.

20. The method of claim 14, wherein the fault location in the first half of the power transmission line is determined from $$\left(((tm2 - tm1) + (tn2 - tn1)) \times \frac{V}{4}\right);$$

wherein the fault location in the second half of the power transmission line is determined from $$\left(L - ((tm2 - tm1) + (tn2 - tn1)) \times \frac{V}{4}\right);$$

and wherein tm1, tm2, tn1, and tn2 are the arrival times of the first and second peaks of the traveling travelling waves detected from measurements carried out at the first and the second terminals respectively, V is the propagation velocity of the traveling waves in the power transmission line, and L is the length of the power transmission line.

21. The method of claim 14, wherein the determining the fault location comprises:

determining the fault location based on a propagation velocity of the traveling waves in the power transmission line and the arrival times of the first and second peaks, the determining being in response to identifying the fault being in the first half of the power transmission line;

determining the fault location based on the propagation velocity of the traveling waves in the power transmission line, length of the power transmission line, and the arrival times of the first and second peaks, the determining being in response to identifying the fault being in the second half of the power transmission line; and determining the fault location based on the length of the power transmission line, the determining being in response to identifying the fault being at the mid-point of the power transmission line.

* * * * *